United States Patent [19]

Kokubo

[11] Patent Number: 5,404,371

[45] Date of Patent: Apr. 4, 1995

[54] SEMICONDUCTOR PULSATION LASER

[75] Inventor: Yoshihiro Kokubo, Itami, Japan

[73] Assignee: Mitsubishi Denki Kabushiki Kaisha, Tokyo, Japan

[21] Appl. No.: 264,333

[22] Filed: Jun. 23, 1994

[30] Foreign Application Priority Data

Jun. 24, 1993 [JP] Japan .................................. 5-153110

[51] Int. Cl.$^6$ ............................................... H01S 3/19
[52] U.S. Cl. ........................................................ 372/45
[58] Field of Search ........................................ 372/45, 46

[56] References Cited

U.S. PATENT DOCUMENTS

| 4,961,197 | 10/1990 | Tanaka et al. | 372/45 |
| 5,003,549 | 3/1991 | Mitsui et al. | 372/46 |
| 5,111,469 | 5/1992 | Narui et al. | 372/46 |

Primary Examiner—James W. Davie
Attorney, Agent, or Firm—Leydig, Voit & Mayer

[57] ABSTRACT

In a semiconductor pulsation laser, an active layer includes a double quantum well structure including two quantum wells. Each of these quantum wells has a plurality of discrete energy levels in which the difference in energies between these energy levels is more than 10 nm when calculated as a wavelength equivalent. These two quantum wells are arranged close each other in the double quantum well structure so that each of the discrete energy levels is divided into two energy levels so that the difference in energies between these two energy levels is equivalent to a difference in energies that provides a frequency at which both electrons and holes are alternatingly present in the two quantum wells in a range from 100 MHz to 10 GHz. The gain at which laser oscillation occurs by recombination of electrons and holes is attained only when both electrons and holes are present in the same well at the same time. As a result, laser oscillation occurs intermittently when both electrons and holes are present in the same well, whereby a pulsation laser is realized.

4 Claims, 7 Drawing Sheets

Fig.1(a)

SEE Fig.1(b)

SEMICONDUCTOR PULSATION LASER

FIELD OF THE INVENTION

The present invention relates to a semiconductor pulsation laser that oscillates intermittently.

BACKGROUND OF THE INVENTION

Figure 10:
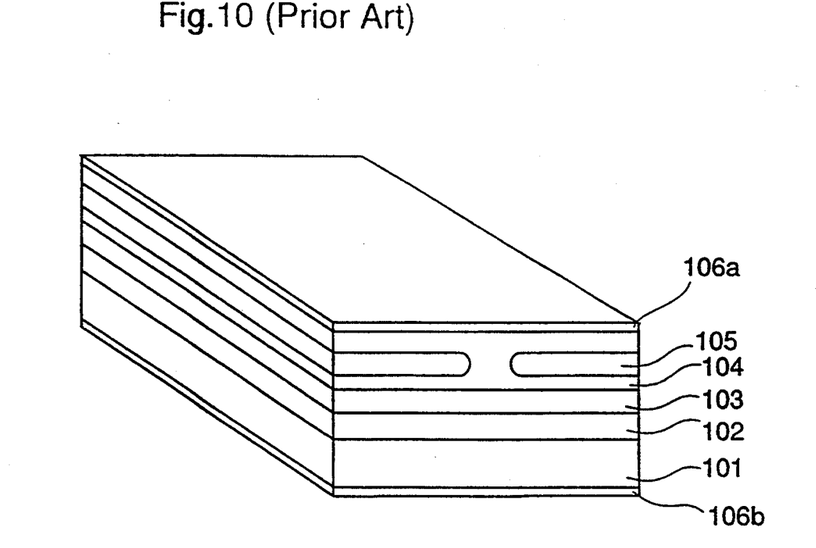
FIG. 10 is a perspective view illustrating a semiconductor pulsation laser according to the prior art.
Figure 11:
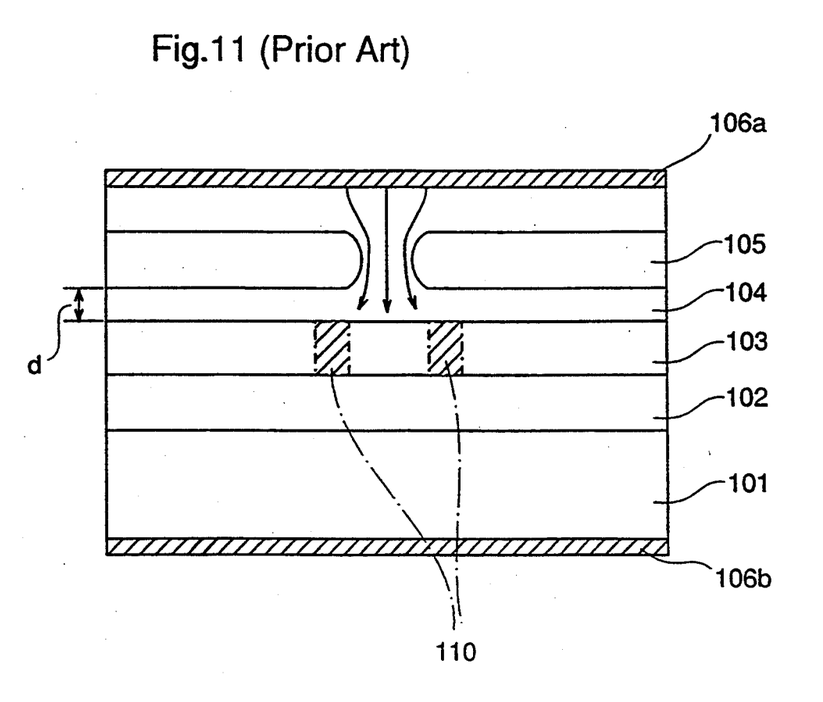
FIG. 11 is a sectional view for explaining the operation of the semiconductor pulsation laser shown in FIG. 10.

FIG. 10 is a perspective view illustrating a prior art pulsation laser. FIG. 11 is a sectional view of a part of the pulsation laser shown in FIG. 10. In these figures, reference numeral 101 designates a first conductivity type semiconductor substrate. A first conductivity type lower cladding layer 102 is disposed on the substrate 101. An active layer 103 is disposed on the lower cladding layer 102. An upper cladding layer 104 of a second conductivity type, opposite the first conductivity type, is disposed on the active layer 103. A first electrode 106b is disposed on the rear surface of the substrate 101 and a second electrode 106a is disposed on the upper cladding layer 104. Reference numeral 105 designates a first conductivity type current blocking layer.

A description is given of the operation. As shown in FIG. 11, current injected into the laser structure from the electrode 106a is concentrated by the current blocking layer 105, somewhat broadened in the upper cladding layer 104 between the current blocking layer 105 and the active layer 103, and injected into the active layer 103. Thereby, light is generated in a region of the active layer 103 where current flows, i.e., a region other than the region directly under the current blocking layer 105, resulting in laser oscillation.

In the active layer 103, the extent of the region where light exists and the extent of the region where current flows in the active layer 103 vary according to the thickness d of the upper cladding layer 104 between the current blocking layer 105 and the active layer 103. When the thickness d is appropriately selected, the extent of the region where light exists becomes larger than the extent of the region where current flows, i.e., a region 110 where no current flows but laser light exists is produced in the active layer 103. This region 110 is called a super-saturated absorption band. In the super-saturated absorption band, light is absorbed until the quantity of electrons and holes generating light reaches a certain value. When the quantity of electrons and holes exceeds that value, electrons and holes which have been stored in that region are output light for a time, and an initial value is attained. That is, the super-saturated absorption band causes intermittent laser oscillation, whereby so-called pulsation laser emission is realized.

In the prior art semiconductor pulsation laser utilizing the super-saturated absorption band, however, both of the region where light exists and the region where current exists are controlled only by the thickness d of the cladding layer between the active layer and the current blocking layer to produce the super-saturated absorption band. Therefore, the respective extent of each region is set at compromised values than at optimum values, and the permissible extent for each of these regions is usually very narrow, resulting in difficulties in design and fabricating of the laser.

Furthermore, in the prior art semiconductor pulsation laser, the frequency of the intermittent laser oscillation varies according to various factors, such as the doping of the respective layers. Therefore, it is very difficult to design a semiconductor pulsation laser, and the trial manufacture must be repeated to attain a desired frequency.

SUMMARY OF THE INVENTION

An object of the present invention is to provide a semiconductor pulsation laser that oscillates intermittently at a desired frequency and that is easily manufactured.

According to an aspect of the present invention, in a semiconductor pulsation laser, an active layer comprises a double quantum well structure including two quantum wells. Each of these quantum wells has a plurality of discrete energy levels in which the difference in energies between these energy levels is more than 10 nm when calculated as a wavelength equivalent. In a pulsation laser according to the present invention, these two quantum wells are arranged close each other in the double quantum well structure so that each of the discrete energy levels is divided into two energy levels wherein the difference in energies between these two energy levels is equivalent to the difference in energies that is obtained according to the wave functions of charge carriers in the double quantum well structure and provides a frequency at which both electrons and holes are present in the two quantum wells in a range from 100 MHz to 10 GHz. Therefore, a gain at which laser oscillation occurs by recombination of electrons and holes is attained only when both electrons and holes are present in the same well at the same time. As a result, the laser oscillation occurs intermittently at the period when both electrons and holes are present in the same well, whereby a pulsation laser is realized.

Other objects and advantages of the present invention will become apparent from the detailed description that follows. The detailed description and specific embodiments described are provided only for illustration since various additions and modifications within the spirit and scope of the invention will be apparent to those of skill in the art from the detailed description.

DETAILED DESCRIPTION OF THE PREFERRED EMBODIMENTS

Figure 1A:
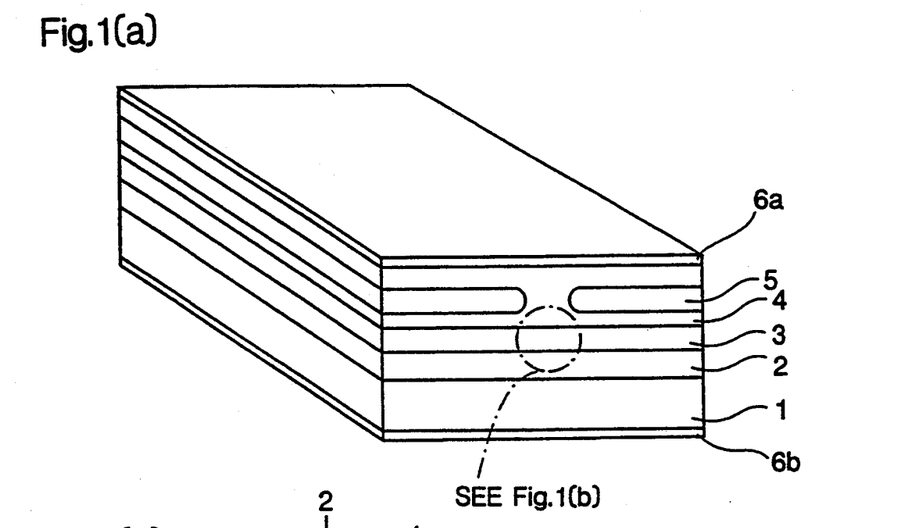
FIG. 1(a) is a perspective view illustrating a semiconductor pulsation laser in accordance with a first embodiment of the present invention.
Figure 1B:
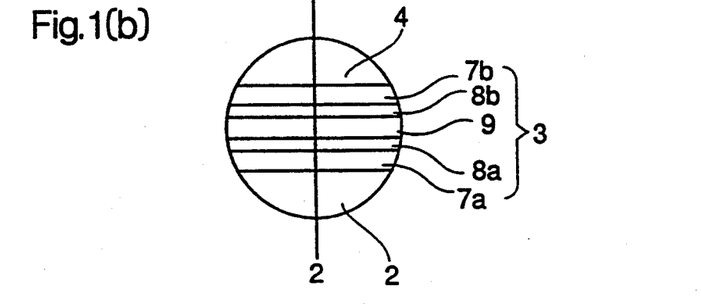
FIG. 1(b) is an enlarged view of a part of the semiconductor pulsation laser.

FIG. 1(a) is a perspective view illustrating a semiconductor pulsation laser in accordance with an embodiment of the present invention, and FIG. 1(b) is an enlarged view of a part of the semiconductor pulsation laser. In FIG. 1(a), reference numeral 1 designates a semiconductor substrate of a first conductivity type. A lower cladding layer 2 of the first conductivity type is disposed on the substrate 1. An active layer 3 is disposed on the lower cladding layer 2. An upper cladding layer 4 of a second conductivity type, opposite the first conductivity type, is disposed on the active layer 3. Reference numeral 5 designates a current blocking layer of the first conductivity type. A first electrode 6b is disposed on the substrate 1 and a second electrode 6a is disposed on the upper cladding layer 4. In FIG. 1(b), reference numerals 7a and 7b designate light confinement layers (barrier layers), numerals 8a and 8b designate first and second well layers, respectively, and numeral 9 designates a barrier layer.

Figure 2:
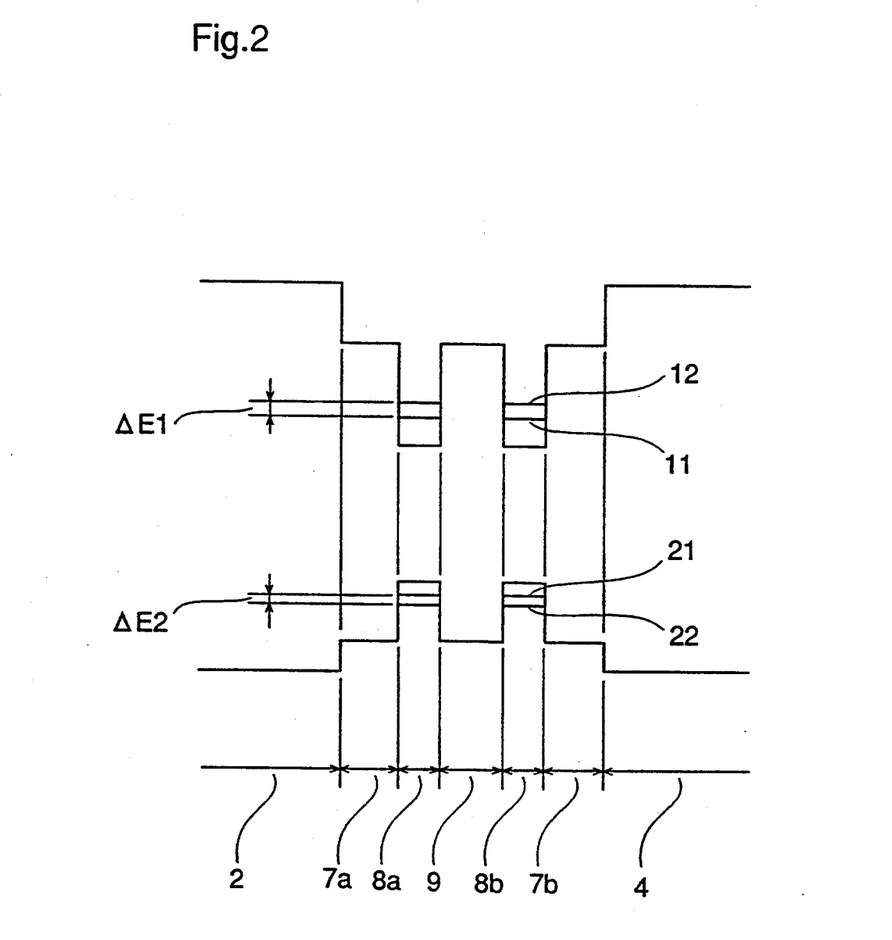
FIG. 2 is an energy band diagram at a cross section taken along a line 2—2 of FIG. 1(b).

FIG. 2 is an energy band diagram at a cross section taken along a line 2—2 of FIG. 1(b). In the figure, the same reference numerals as in FIG. 1(b) designate the same parts. Reference numeral 11 designates a first electron energy level, numeral 12 designates a second electron energy level, numeral 21 designates a first hole energy level, and numeral 22 designates a second hole energy level.

Figure 12A:
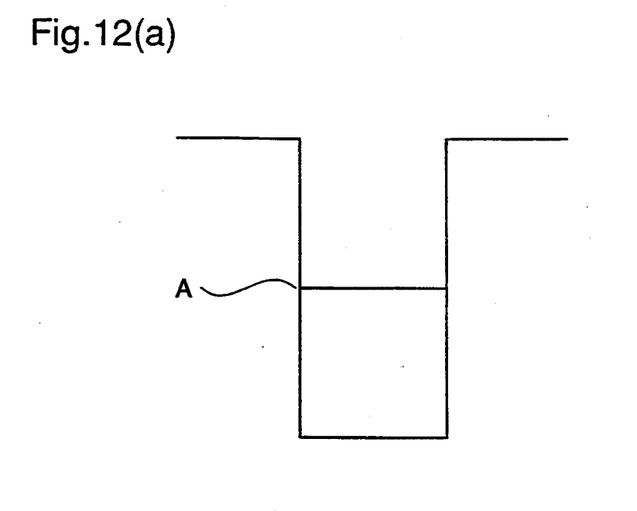
FIGS. 12(a) and 12(b) are schematic diagrams for explaining the generation of subbands in quantum wells.
Figure 12B:
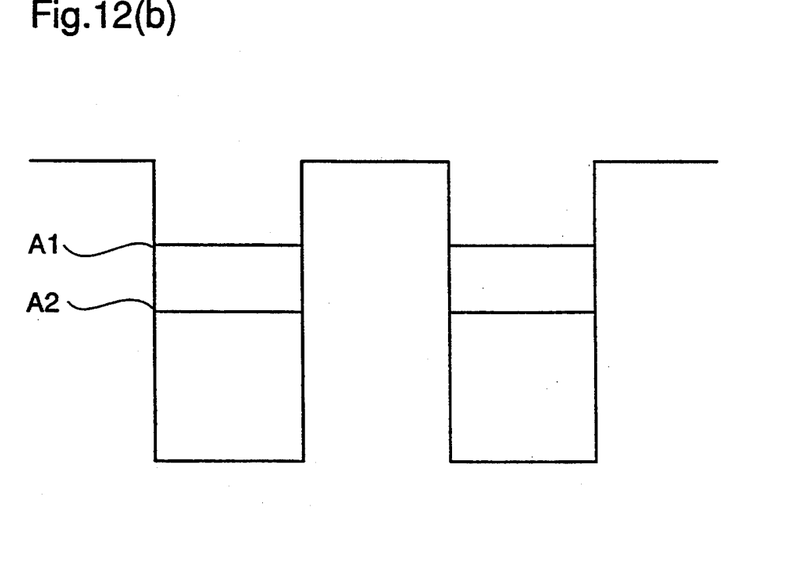

In a quantum well structure comprising a well layer and two barrier layers sandwiching the well layer, for example, electrons are confined within the well layer because of the difference in band gap energies between the well layer and the barrier layer. These band gap energies produce a degenerate and discrete quantum energy A in the well layer as shown in FIG. 12(a). Although only one quantum energy level A is shown in FIG. 12(a) for simplification, a plurality of quantum energy levels are produced. When two well layers are arranged close to each other as shown in FIG. 12(b), the quantum energy levels A produced in the two well layers overlap and are, therefore, divided into two levels A1 and A2. The first and second levels shown in FIG. 2 are these levels (subbands) caused by division of the discrete energy levels produced in a single quantum well because the two quantum wells are close to each other.

When a voltage is applied across the electrodes 6a and 6b in a forward direction with respect to the pn junction of the laser, carriers are injected into the active layer 3 and recombine within the first and second well layers 8a and 8b of the active layer 3 to produce light, resulting in laser oscillation. In each of the well layers 8a and 8b, electrons at the first level 11 recombine with holes at the first level 21, and electrons at the second level 12 recombine with holes at the second level 22.

A description is given of the principle of the intermittent laser oscillation of the semiconductor pulsation laser according to the invention.

Figure 3:
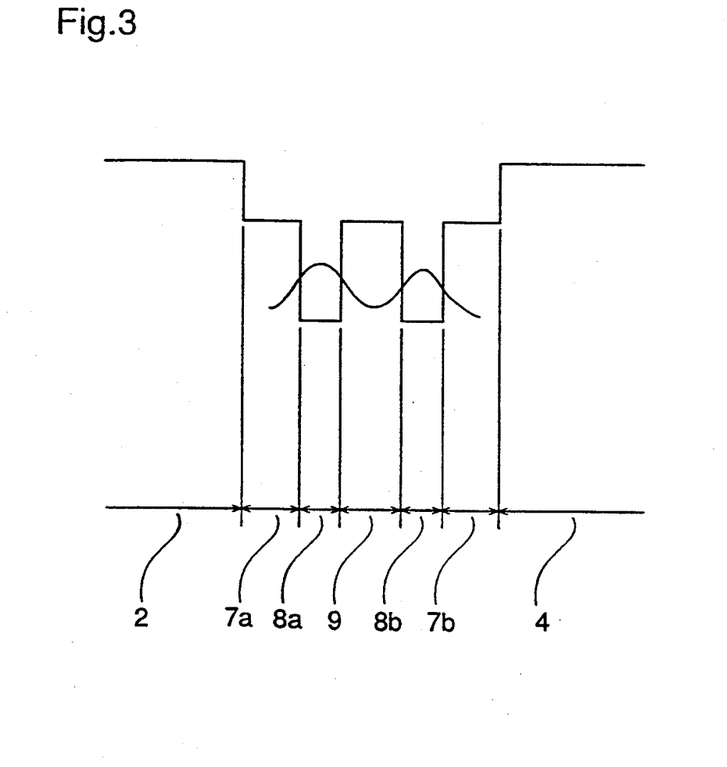
FIG. 3 is a diagram illustrating a wave function of electrons at a first level.
Figure 4:
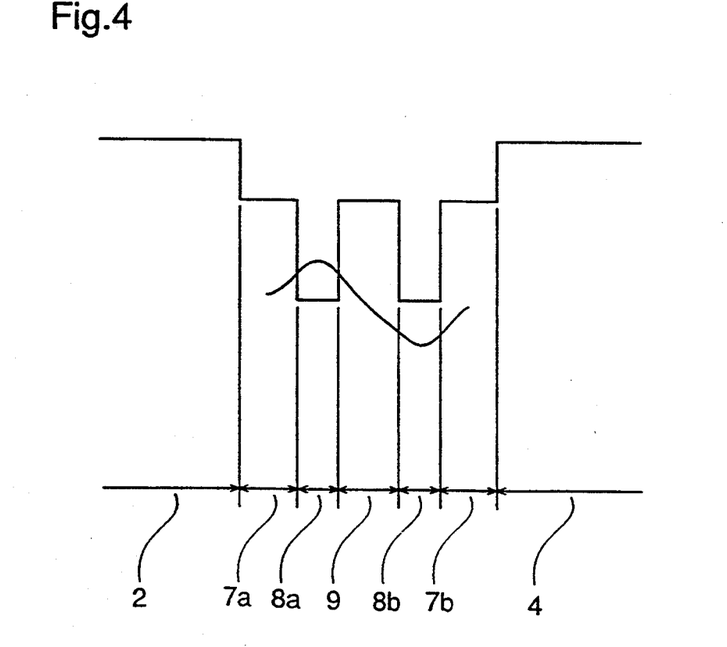
FIG. 4 is a diagram illustrating a wave function of electrons at a second level.

A wave function of the first electron level 11 and a wave function of the second electron level 12 are illustrated in FIGS. 3 and 4, respectively.

The wave function $\psi 1$ of the first electron level 11 and the wave function $\psi 2$ of the second electron level 12 are respectively represented by $$\psi 1 = \phi 1 e^{j\omega 1 t} \quad (1)$$

$$\psi 2 = \phi 2 e^{j\omega 2 t} \quad (2)$$

where $\phi 1$ and $\phi 2$ are space factors of the respective wave functions, $e^{j\omega 1 t}$ and $e^{j\omega 2 t}$ are time factors of the respective wave functions, j is the imaginary unit, $\omega 1$ is the characteristic angular frequency corresponding to the first level 11, $\omega 2$ is the characteristic angular frequency corresponding to the second level 12, and t is time. As shown in FIGS. 3 and 4, the wave function of the first level 11 is an even function, and the wave function of the second level 12 is an odd function. In addition, wave functions of holes have the same waveforms as the wave functions of electrons shown in FIGS. 3 and 4.

Since electrons travel between the first level 11 and the second level 12, the wave function $\psi$ of electrons in this double quantum well structure is the sum of the wave function $\psi 1$ of the first level 11 and the wave function $\psi 2$ of the second level 12, i.e., the wave function $\psi$ is given by $$\psi = \psi 1 + \psi 2 = \phi 1 e^{j\omega 1 t} \phi 2 e^{j\omega 2 t} \quad (3)$$

The phase of electrons is an irregular factor, so that any phase can be taken. Therefore, the wave function of electrons of the double quantum well structure represented by the equation (3) is reduced to $$\psi = \phi 1 e^{j(\omega 2 - \omega 1)t} + \phi 2 \quad (4)$$

whereby the time factors are united.

Figure 5:
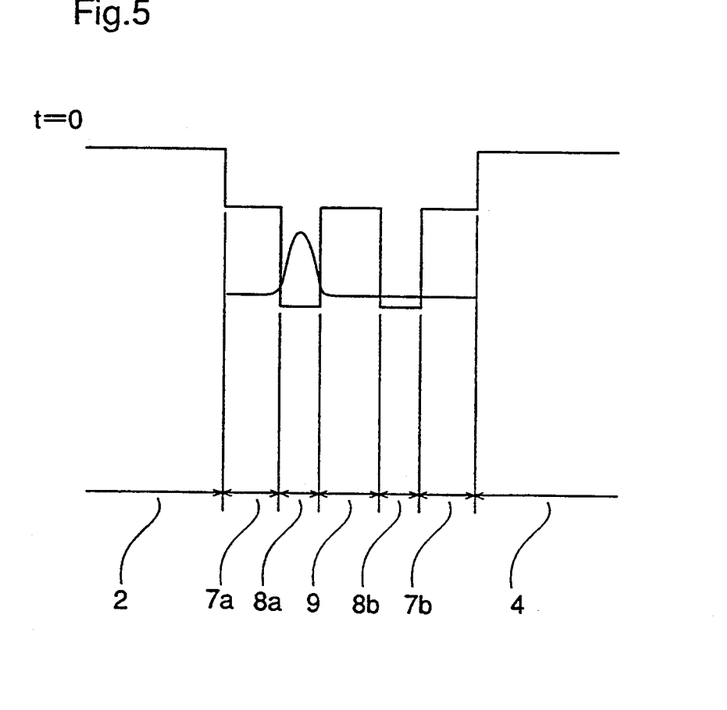
FIG. 5 is a diagram illustrating a spatial distribution of the wave function of electrons in a double quantum well structure at t=0.
Figure 6:
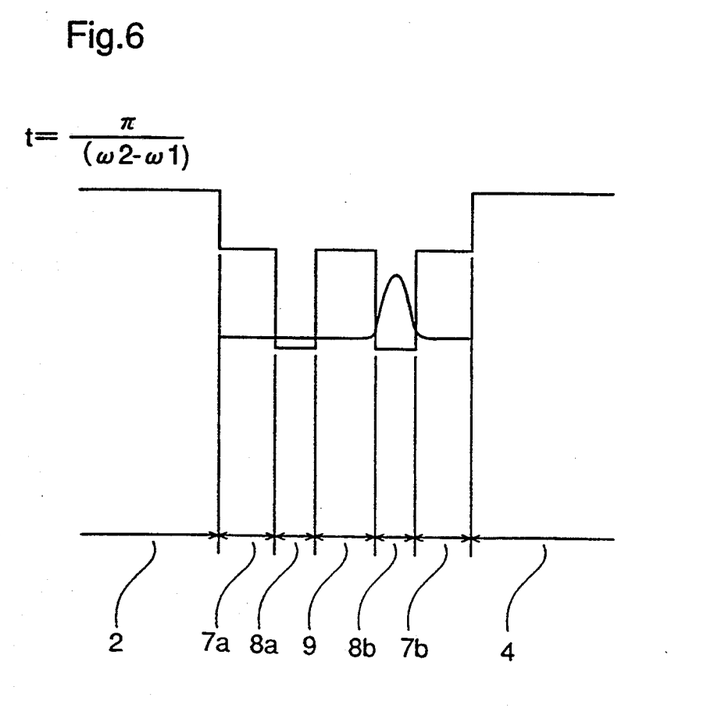
FIG. 6 is a diagram illustrating a spatial distribution of the wave function of electrons in the double quantum well structure at $t=\pi/(\omega 2-\omega 1)$.

In the wave function given by the equation (4), when the time t is 0, $\psi$ is equal to $\phi 1 + \phi 2$, and the waveform of this function has a spatial distribution of electrons localized in the first well layer 8a as shown in FIG. 5. When the time t is $\pi/(\omega 2 - \omega 1)$, $\psi$ is equal to $-\phi 1 + \phi 2$, and the waveform of this function has a spatial distribution of electrons localized in the second well layer 8b as shown in FIG. 6. In other words, the wave function of electrons in the double quantum well structure shows a special distribution that is localized alternatingly in the two quantum wells at a period of $2 \times \pi/(\omega 2 - \omega 1)$.

In addition since, the square of the absolute value of the wave function represents the probability of the presence of electrons (or holes), the probability of the presence of electrons (or holes) in the combined quantum wells is represented by $$|\phi 1 e^{j\omega 1 t} + \phi 2 e^{j\omega 2 t}|^2 =$$
$$(\phi 1 e^{j\omega 1 t} + \phi 2 e^{j\omega 2 t})(\phi 1^* e^{-j\omega 1 t} + \phi 2^* e^{-j\omega 2 t}) =$$
$$\phi 1^* \phi 2 e^{j(\omega 2 - \omega 1)t} |\phi 1|^2 + |\phi 2|^2 + \phi 1 \phi 2^* e^{-j(\omega 2 - \omega 1)t} + =$$
$$|\phi 1|^2 + |\phi 2|^2 + 2 \cdot Re[\phi 1^* \phi 2 e^{j(\omega 2 - \omega 1)t}]$$

That is, electrons (or holes) show a spatial distribution that is localized alternatingly in the two quantum wells at a frequency determined by ($\omega2-\omega1$).

Assuming that the difference in energies between electrons at the first level 11 and electrons at the second level 12 is $\Delta E1$ and the difference in energies between holes at the first level 21 and holes at the second level 22 is $\Delta E2$, electrons travel between the first well layer and the second well layer at a frequency given by $$vc = \frac{\Delta E1}{h} \quad (5)$$

and holes travel between the first well layer and the second well layer at a frequency given by $$vv = \frac{\Delta E2}{h} \quad (6)$$

Since $\Delta E1$ is usually different from $\Delta E2$, electrons and holes travel between the first well layer and the second well layer at different frequencies, and there is a periodic event when both electrons and holes are present in the same well.

The frequency $\gamma$ at which electrons and holes are present in the same well layer is given by $$v = \frac{\Delta E1}{mh} = \frac{\Delta E2}{nh} \quad (7)$$

where m and n are integers. A gain at which laser oscillation occurs by recombination of electrons and holes is attained only when both electrons and holes are present in the same well at a time. As a result, the laser oscillation occurs intermittently when electrons and holes are present in the same well, whereby a pulsation laser is realized.

However, when the frequency $\gamma c$ of electrons is sufficiently higher than the frequency $\gamma v$ of holes, the frequency $\gamma$ at which electrons and holes are present in the same well layer is approximately equal to the frequency $\gamma c$ of electrons.

As described above, in the semiconductor pulsation laser according to the present invention, the period of the pulsation is determined according to the differences $\Delta E1$ and $\Delta E2$ in energies between the subbands produced in the double quantum well structure. Desired values for the differences $\Delta E1$ and $\Delta E2$ are easily attained with high precision by appropriately selecting material compositions and dimensions of the quantum well layers 8a and 8b, the barrier layer 9, and the light confinement layers 7a and 7b included in the double quantum well structure. Generally, a pulsation frequency desired for a pulsation laser is in a range from 100 MHz to 10 GHz. Therefore, the material compositions and the dimensions of the respective layers included in the double quantum well structure are selected so that the frequency $\gamma$ given by the equation (7) is within this range.

As described above, subbands are formed when two quantum wells each having a plurality of discrete energy levels are arranged close to each and each of these discrete energy levels is divided into two levels. However, when two quantum wells each having a plurality of discrete energy levels in which a difference in energies between those energy levels is small are arranged close to each other to produce a double quantum well structure, first subbands produced by division of one discrete energy level and second subbands produced by division of another discrete energy level are arranged at narrowly separated energy levels. Usually, the distribution of charge carriers in a quantum well has an extension of about 2 nm, when calculated as a wavelength equivalent, with respect to each energy level. Therefore, if the second subbands are produced within this range of the first subbands, charge carriers travel between these subbands, so that the above-described difference in energies between the subbands is not determined. As a result, operation at a desired frequency is not achieved. In order to prevent such a disadvantage, in each quantum well included in the double quantum well structure, it is desired that the difference in energies between a plurality of discrete energy levels produced in that quantum well be more than 10 nm when calculated as a wavelength equivalent.

Specific numerical values in a case where the semiconductor pulsation laser of the present invention comprises AlGaAs will be described. When the semiconductor pulsation laser comprises $Al_xGa_{1-x}As$, since the frequency $\gamma c$ of electrons is significantly higher than the frequency $\gamma v$ of holes, the frequency $\gamma$ at which electrons and holes are present in the same well layer is approximately equal to the frequency $\gamma c$ of electrons. Assuming that the Al composition ratio x and the thickness of the first and second well layers 8a and 8b are 0.1 and 8 nm, respectively, and the Al composition ratio x and the thickness of the light confinement layers 7a and 7b and the barrier layer 9 are 0.35 and 14 nm, respectively, since $\Delta E1$ is equal to $6.8\times10^{-6}$ eV, a semiconductor pulsation laser oscillating at a frequency $\gamma$ of 1.6 GHz is achieved. In this laser, the difference in energies between discrete energy levels produced in each quantum well is about 15 nm when calculated as a wavelength equivalent.

The above-described embodiment of the present invention is a quantum well laser in which the quantum wells included in the double quantum well structure are thin films, i.e., one-dimensional quantum well layers (quantum well layer laser). However, the present invention may be applied to a two-dimensional quantum well laser including a double quantum well structure comprising linear quantum wells (quantum well line laser) or a three-dimensional quantum well laser including a double quantum well structure including box-shaped quantum wells (quantum well box laser).

Figures 7A, 7B:
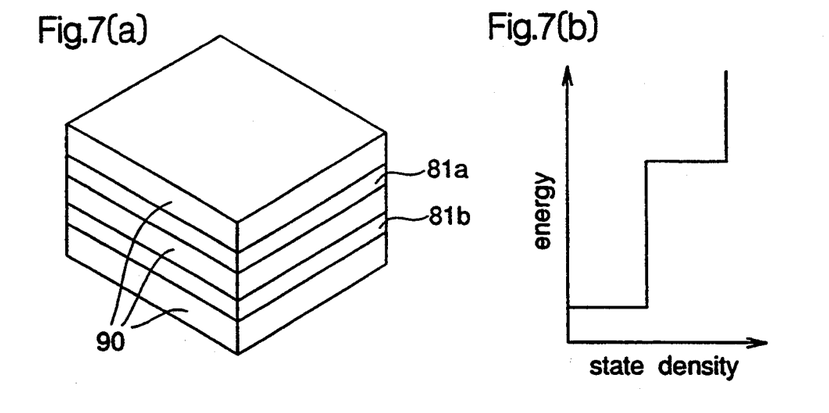
FIG. 7(a) is a perspective view of a double quantum well layer structure including thin film quantum wells.
FIG. 7(b) illustrates the density of electron states in that structure.
Figures 8A, 8B:
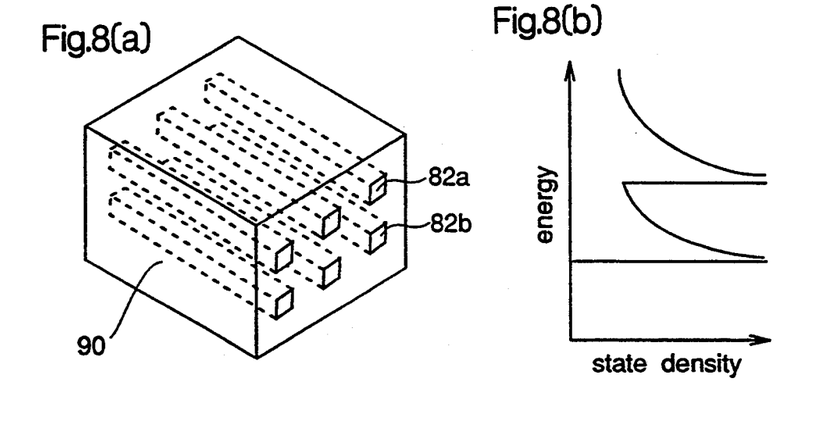
FIG. 8(a) is a perspective view of a double quantum well line structure including linear quantum wells.
FIG. 8(b) illustrates the density of electron states in that structure.
Figures 9A, 9B:
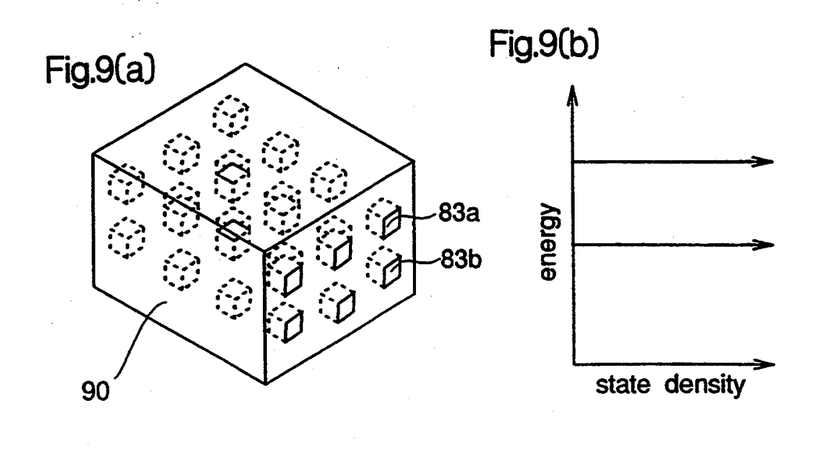
FIG. 9(a) is a perspective view of a double quantum well box structure including box quantum wells.
FIG. 9(b) illustrates the density of electron states in that structure.

FIGS. 7(a) and 7(b) illustrate a double quantum well structure including thin film quantum wells and the electron state density in the structure. FIGS. 8(a) and 8(b) illustrate a double quantum well structure including linear quantum wells and the electron state density in the structure. FIGS. 9(a) and 9(b) illustrate a double quantum well structure including box quantum wells and the electron state density in the structure. In these figures, reference numerals 81a and 81b designate quantum well layers, numerals 82a and 82b designate quantum well lines, numeral 83a and 83b designate quantum well boxes, and numeral 90 designates barrier layers.

It is found from these figures that the electron state density in the double quantum well structure sharpens with a reduction in the degree of freedom of electrons. Therefore, in the above-described embodiment of the invention, if the quantum well layers are replaced with quantum well lines or boxes, superior effects are achieved.

What is claimed is:

1. A semiconductor pulsation laser including:

a semiconductor substrate; and an active layer comprising a double quantum well structure and disposed on the semiconductor substrate, said double quantum well structure including two quantum wells, each quantum well having a plurality of discrete energy levels separated in energy by more than 10 nm when calculated as a wavelength equivalent when the two quantum wells do not interact, the two quantum wells being disposed sufficiently close to each other so that the discrete energy levels are divided into two energy levels separated by an energy equivalent to an energy difference that produces an oscillation frequency at which both electrons and holes are alternatingly present in the two quantum wells in a range of from 100 MHz to 10 GHz.

2. The semiconductor pulsation laser of claim 1 wherein the active layer comprises a double quantum well layer structure.

3. The semiconductor pulsation laser of claim 1 wherein the active layer comprises a double quantum well line structure.

4. The semiconductor pulsation laser of claim 1 wherein the active layer comprises a double quantum well box structure.

* * * * *